US012218275B2

(12) United States Patent
Bi et al.

(10) Patent No.: US 12,218,275 B2
(45) Date of Patent: Feb. 4, 2025

(54) SEMICONDUCTOR TEMPLATE AND FABRICATION METHOD

(71) Applicant: HEXAGEM AB, Hjarup (SE)

(72) Inventors: Zhaoxia Bi, Lund (SE); Jonas Ohlsson, Malmo (SE); Lars Samuelson, Malmo (SE)

(73) Assignee: HEXAGEM AB, Hjarup (SE)

( * ) Notice: Subject to any disclaimer, the term of this patent is extended or adjusted under 35 U.S.C. 154(b) by 570 days.

(21) Appl. No.: 17/436,818

(22) PCT Filed: Mar. 18, 2020

(86) PCT No.: PCT/EP2020/057451
§ 371 (c)(1),
(2) Date: Sep. 7, 2021

(87) PCT Pub. No.: WO2020/187986
PCT Pub. Date: Sep. 24, 2020

(65) Prior Publication Data
US 2022/0246797 A1    Aug. 4, 2022

(30) Foreign Application Priority Data

Mar. 18, 2019  (EP) .................................. 19163334
Mar. 9, 2020   (EP) .................................. 20161913

(51) Int. Cl.
*H01L 33/00*   (2010.01)
*H01L 33/06*   (2010.01)
(Continued)

(52) U.S. Cl.
CPC ............ *H01L 33/24* (2013.01); *H01L 33/007* (2013.01); *H01L 33/06* (2013.01); *H01L 33/32* (2013.01)

(58) Field of Classification Search
CPC ....... H01L 33/24; H01L 33/007; H01L 33/06; H01L 33/32; H01L 21/02381;
(Continued)

(56) References Cited

U.S. PATENT DOCUMENTS 9,653,286 B2    5/2017  Ohlsson et al.
10,431,717 B1*  10/2019 Dasgupta .............. H01L 33/325
(Continued)

FOREIGN PATENT DOCUMENTS

CN    1447990 A    10/2003
CN    1698213 A    11/2005
(Continued)

OTHER PUBLICATIONS

Notification of Transmittal of the International Search Report and the Written Opinion of the International Searching Authority for International Patent Application No. PCTEP2021/057451, mailed on Mar. 18, 2020, 12 pages.
(Continued)

*Primary Examiner* — Samuel Park
(74) *Attorney, Agent, or Firm* — THE MARBURY LAW GROUP PLLC

(57) ABSTRACT

A method for fabrication of an InGaN semiconductor template, comprising growing an InGaN pyramid having inclined facets on a semiconductor substrate; processing the pyramid by removing semiconductor material to form a truncated pyramid having a first upper surface; growing InGaN, over the first upper surface, to form an InGaN template layer having a c-plane crystal facet forming a top surface. The InGaN semiconductor template is suitable for further fabrication of semiconductor devices, such as microLEDs configured to emit red, green or blue light.

13 Claims, 9 Drawing Sheets

(51) Int. Cl.
*H01L 33/24* (2010.01)
*H01L 33/32* (2010.01)

(58) Field of Classification Search
CPC .......... H01L 21/0242; H01L 21/02513; H01L 21/02516; H01L 21/0254; H01L 21/02609; H01L 21/0262; H01L 21/02639; H01L 21/02458
See application file for complete search history.

(56) References Cited

U.S. PATENT DOCUMENTS

| | | | |
|---|---|---|---|
| 10,991,578 | B2 | 4/2021 | Ohlsson |
| 2005/0174023 | A1* | 8/2005 | Nakajima ............... H01L 33/24 313/30 |
| 2010/0187568 | A1 | 7/2010 | Arena |
| 2016/0087150 | A1* | 3/2016 | Ristic ..................... H01L 33/18 438/37 |
| 2017/0316932 | A1 | 11/2017 | Ohlsson et al. |
| 2020/0035860 | A1* | 1/2020 | Michiue ................. H01L 33/24 |
| 2020/0058489 | A1 | 2/2020 | Ohlsson |

FOREIGN PATENT DOCUMENTS

| | | | |
|---|---|---|---|
| CN | 104205294 A | 12/2014 | |
| CN | 109075022 A | 12/2018 | |
| KR | 20160098661 A | 8/2016 | |
| WO | WO2013/121289 A2 | 8/2013 | |
| WO | WO2017/137635 A1 | 2/2017 | |
| WO | WO-2017168012 A1 * | 10/2017 | ......... H01L 21/0242 |
| WO | WO2019/068919 A1 | 10/2018 | |

OTHER PUBLICATIONS

Bi, Z. et al., "InGaN Platelets: Synthesis and Applications toward Green and Red Light-Emitting Diodes," Nano Lett. 2019, vol. 19, No. 5, pp. 2832-2839, (2019); https://doi.org/10.1021/acs.nanolett.8b04781.

Chinese Office Communication, First Office Action for PRC (China) Patent Application No. 202080021726.7, mailed on Jun. 26, 2024, 8 pages.

Chinese Office Communication, Office Action for PRC (China) Patent Application No. 2020800217267, mailed on Dec. 13, 2024, 7 pages.

* cited by examiner

| Sample | Bottom InGaN layer 7 | | | Top InGaN layer 10 | | |
|---|---|---|---|---|---|---|
| | PL peak /eV | In content_PL | In content_EDS | PL peak /eV | In content_PL | In content_EDS |
| $In_{0.09}Ga_{0.91}N$ | 2.97±0.01 | 9.2%±0.2% | 7.7%±0.4% | 2.98±0.01 | 8.9%±0.1% | 9.1%±0.4% |
| $In_{0.18}Ga_{0.82}N$ | 2.63±0.01 | 16.8%±0.1% | 12.6%±0.6% | 2.58±0.01 | 17.9%±0.3% | 19.6%±0.7% |

Fig. 11I  Table 1

SEMICONDUCTOR TEMPLATE AND FABRICATION METHOD

TECHNICAL FIELD

The present invention relates to semiconductor templates and methods for fabricating such templates. More particularly, the invention relates to Indium Gallium Nitride templates having a relaxed and dislocation-free template layer with a planar c-oriented surface, suitable to serve as a template for carrying electronic or opto-electronic components.

BACKGROUND

Semiconductor wafers are typically fabricated by liquid phase epitaxy, most often the Czochralski-method, already invented in 1916 by Jan Czochralski. In the Czochralski-process thermally induced precipitation of liquid state material to a solid state crystal is realized by slowly pulling a monocrystalline seed from a hot liquid melt. This process is the predominantly used method for fabrication of semiconductor wafers used by the semiconductor industry and crystal growth by a liquid/solid phase transition, liquid phase epitaxy (LPE), is still the only established method for fabrication-method of high perfection large diameter semiconductor crystal wafers, be it Si, Ge, GaAs, GaP, or InP semiconductors. Crystal defects, such as impurities, vacancies and crystal dislocations can, already at extremely low concentrations, deteriorate electrical and optical properties of the semiconductor. Over hundred years there is little that has changed within the basic fabrication of semiconductor material and the designation of Jan Czochralski as "The father of Semiconductor technology" is as valid today as it was then.

The group of binary III-V semiconductors comprising GaN, AlN, InN and their ternary and quaternary alloys are usually simply referred to as "nitrides". The nitrides are unique in their span of properties and potential use. Based on theoretical properties alone, the nitrides comprise the most efficient semiconductor alternatives for high power, radio frequency, and the only viable alternative for true RGB white light-sources and short wavelength LEDs and Lasers from violet through UV. They are, however, also unique in being the only commonly used semiconductors where LPE isn't used to produce wafers. Instead they are usually fabricated by mismatched growth on other crystal substrates, such as SiC, Sapphire and Si wafers. This is unfortunate, since the mismatched crystal growth generates high densities of crystal dislocations.

The predominant challenge for making high perfection semiconductor nitrides is the inability to establish epitaxial conditions close to thermal equilibrium. This is a result of the impossibility to create and contain liquid GaN. Alternative methods for fabricating bulk GaN have been developed, such as ammonothermal growth, solution-based growth and HVPE, each with their own advantages. While they represent great strides forward to an extremely challenging system, they all rely on transport mechanism and comes short of the previously discussed ideal equilibrium conditions of a pure liquid-solid system where the similar density of the liquid and solid phase ensures immediate access to growth species at the growth site, unrestricted by diffusion. Nowadays, there are commercially available small sized bulk GaN, having dislocation densities—around $10E5$ $cm^{-2}$, although at very high price levels and limited quantities.

For various types of electronic devices, such as HEMT (high electron mobility transistor) or HFET (heterojunction field effect transistor) structures, III-nitride materials such as Gallium nitride (GaN) material have superior properties with regard to e.g. electron mobility (speed, efficiency) and high voltage ability than both Si-based materials. However, GaN technology generally entail higher cost than Si technology, and is often inferior in material quality and high voltage reliability compared to e.g. SiC technology. This due to the use of foreign substrates necessitated by inability to fabricate sufficient production levels of GaN native substrates at commercially viable cost levels, and to the fact that no alternative substrate material has properties compatible with the growth of III-nitrides. Thus, major limits of GaN electronics technology boil down to material crystal dislocations and wafer production cost, related to minimization of dislocations originating from growth on foreign substrates, such as SiC.

Various solutions to these problems were suggested by one of the instant inventors in US2015/0014631. In that application, a method for making a semiconductor device was described, including steps for forming a plurality of semiconductor GaN nanowires over a substrate through an insulating growth mask located over a substrate, forming a GaN volume element on each nanowire, planarizing each volume element to form a plurality of discreet GaN semiconductor mesas having substantially planar upper surfaces, and forming a device in each of the plurality of base elements. Each mesa has a substantially planar c-plane (0001) upper surface.

For various purposes, careful composition of semiconductor material is crucial for fabrication of semiconductor devices. This includes e.g. fabrication of particular opto-electronic devices, such as LEDs (Light-Emitting Diode). While blue LEDs have been fabricated using InGaN active layers grown on a GaN template, lattice mismatch issues arise when the amount of In rises above about 10%. This makes it difficult to fabricate highly efficient LEDs configured to emit green or red light, when grown on a GaN template surface. Today, AlInGaP has been used to produce red LEDs. This design may not be suitable for all purposes, e.g. when a pixel size of 10 μm or less is required, such as for small displays, since the AlInGaP LED cannot be made sufficiently small due to surface state -recombination issues.

SUMMARY

A general object is to provide a semiconductor template usable for fabrication of semiconductor devices. An aspect of this object is to provide a semiconductor template suitable for fabrication of electronic or opto-electronic devices, such as LEDs. Another aspect of this object is to provide a semiconductor template which overcomes the drawbacks of the state of the art.

The proposed solution is defined by the terms of the independent claims. Various embodiments are set out in the dependent claims, and in the following detailed description.

BRIEF DESCRIPTION OF THE DRAWINGS

Preferred embodiments of the invention will now be described with reference to the accompanying drawings.

DETAILED DESCRIPTION

Figure 1A:
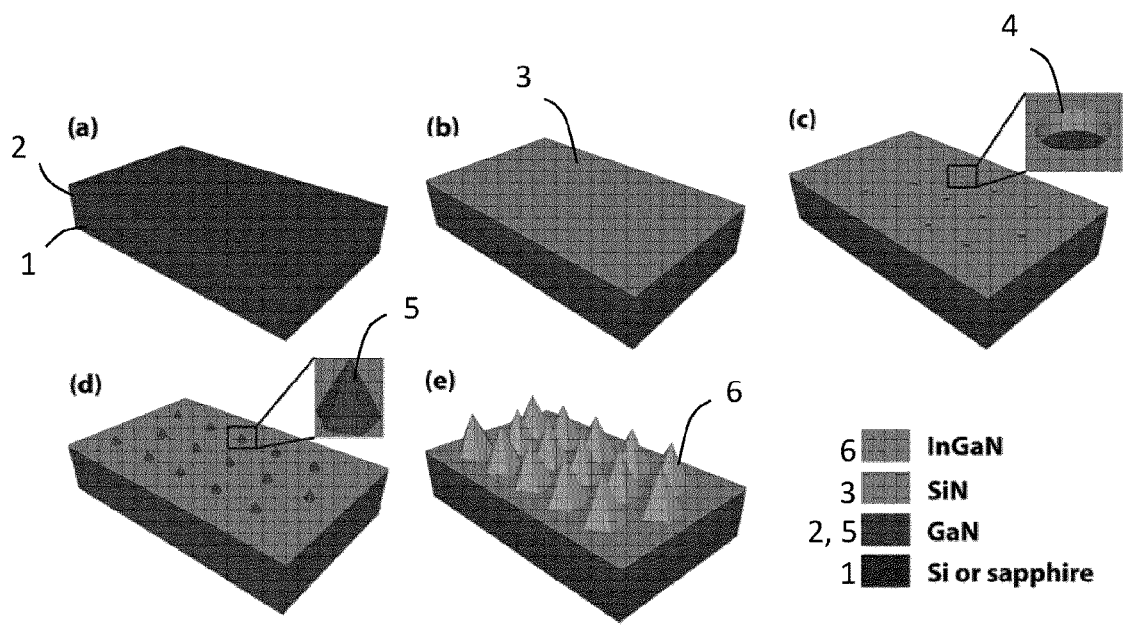
FIG. 1 schematically illustrates various fabrication steps for preparing one or more pyramids of InGaN, epitaxially grown on a semiconductor substrate according to various embodiments.

Certain embodiments of the invention relate to methods of making a III-nitride semiconductor device, specifically InGaN. The method may comprise forming a plurality of semiconductor seeds over a substrate. The substrate may be any suitable material for growing III-nitride seeds or nanowires, for example a GaN, silicon, SiC, sapphire or AN wafer which may optionally contain one or more buffer layers, such as a GaN buffer layer on a silicon substrate. For homogeneous fabrication of GaN wafers and arrays the basic atomic information the substrate material provides to the process is a uniform crystal orientation to all seeds and a competitive surface for selective nucleation of GaN. Such a surface may be provided through thin films, such as a GaN layer. An InGaN semiconductor volume element is grown on each seed. In a planarizing step, a plurality of discrete templates, or base elements, having a substantially planar upper surface, are formed. After planarizing, a step of c-plane surface repair growth is further performed. Subsequent steps may include forming a device, such as an electronic component, in or on each of the plurality of base elements.

Different embodiments will now be discussed with reference to the drawings. It shall be noted that reference is made to certain examples of devices and methods, where materials and process parameters of working embodiments are given. This does not, as such, mean that certain steps or features may be of a different character or art without departing from the general scope of the solutions proposed herein, and which fall within the scope of the appended claims.

FIG. 1 schematically illustrates preparation steps in the fabrication of an InGaN semiconductor device. Ternary InGaN alloys are widely used as active layers (or quantum wells) in nitride LEDs and laser diodes. The thickness of the InGaN active layers is usually no more than 3 nm, mainly in order to limit impacts of quantum confined Stark effect (QCSE) which reduces the spatial overlap between the electron and hole wave functions in the quantum wells. Another reason is that the crystal quality of InGaN can deteriorate quickly when the layer is grown thick, partly due to a large miscibility gap between GaN and InN but mainly due to strain effects from the growth on mismatched substrates. However, the prospect of thick and relaxed InGaN films is highly desirable, for the use as a substrate for nitride optoelectronic devices where high indium-content InGaN active layers are needed.

Selective area growth has been widely used to fabricate GaN in order to reduce density of dislocations arising from the lattice mismatch between the substrate and epitaxial GaN layers. Dislocation-free GaN structures, including nanowires and pyramids, can be grown if the mask openings are made sufficiently small, such as 200 nm or less. In contrast to GaN, growth selectivity can be weak for InGaN with growth on the mask competing with growth from the mask openings. Furthermore, the InGaN nucleation in the mask openings can be random.

As an initial stage in the fabrication of an InGaN template according to the solutions presented herein, selective area growth of hexagonal InGaN pyramids with a diagonal base size of several hundred nanometers, such as >400 nm, is used. The InGaN pyramids are grown from nanometer-scale circular openings in a SiN mask deposited on a (0001)-oriented GaN film. These pyramids have $\{10\bar{1}1\}$ side facets, and occasionally a small flat (0001) top facet. Challenges in the growth of high quality InGaN pyramids include random initial nucleation of InGaN and competing growth of InGaN on $\{10\bar{1}1\}$ and (0001) planes. These effects are suppressed by initial growth of an ideally shaped GaN seed before the InGaN growth. This improves controls of InGaN nucleation and competitive growth.

As indicated in FIG. 1A, in a step a) a base substrate 1 of e.g. sapphire or Si is provided, provided with one or more layers 2 of c-oriented GaN formed on the base substrate 1, also referred to as a buffer layer. In a step b) a mask layer 3 of e.g. $SiN_x$ is formed on top of the GaN layer 2. In a subsequent step c), holes 4 are provided in the mask layer 3, e.g. by means of EBL (electron beam lithography). The holes may be very narrow, e.g. with a diameter of 50-150 nm, or 60-100 nm. The pitch between the holes 4 may e.g. be in the order of 200-2000 nm. In a step d) growth of a seed 5 of a first III-nitride material, such as GaN, is performed. In a subsequent step e), hexagonal pyramids 6 of InGaN are epitaxially grown from the seeds 5. The growth takes place with gallium and indium species primarily diffusing from the SiN mask surface to the openings, without any nucleation on the mask surface. This way, growth of InGaN pyramids with an indium composition up to 20% has been realized, as determined by photoluminescence (PL) measurements.

Figure 1B:
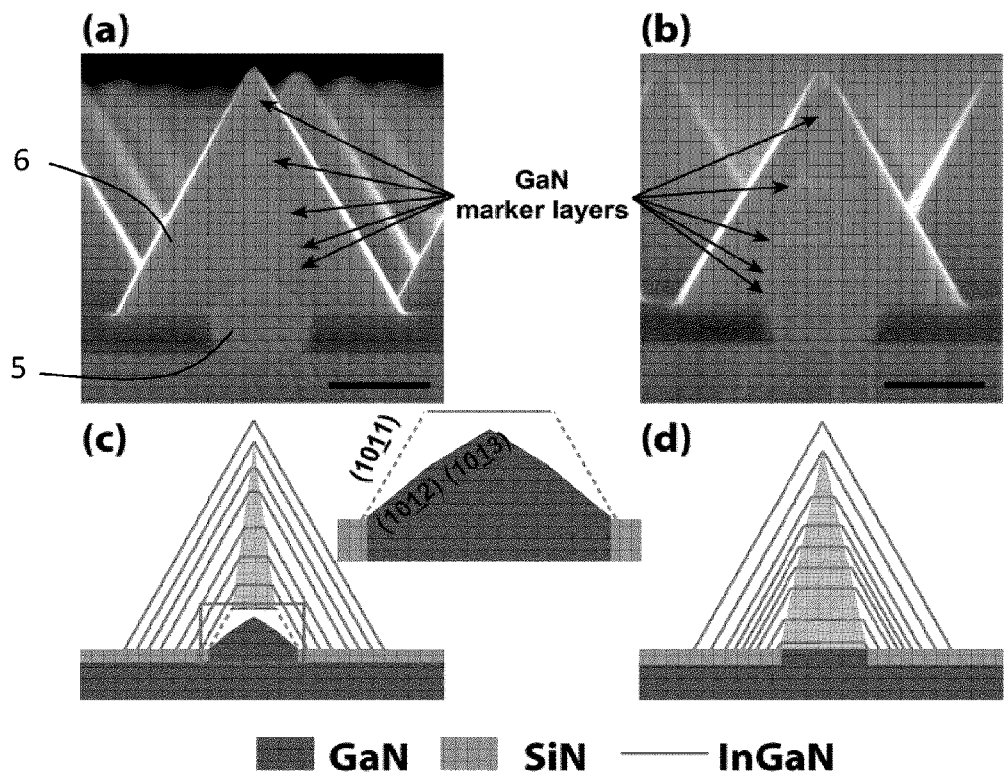

FIG. 1B shows cross-sectional SEM images of two InGaN pyramids. Here, (a)/(c) shows InGaN grown on a fully developed GaN seed exhibiting six equivalent pyramid facets, whereas (b)/(d) shows growth on a partly formed GaN seed without a pyramid top. In order to be able to compare the growth front evolution in these two types of InGaN pyramids, 5 thin GaN marker layers were inserted during the InGaN growth. The marker layers show that, in both cases, the InGaN growth occurs on two types of crystal planes of $\{10\bar{1}1\}$ and (0001), before the full InGaN pyramids develop. The InGaN grown between the third and fourth marker layers was used to obtain the InGaN growth rate ratio between (0001) and {101‾1} planes. This ratio is 4.1±0.7 for the growth on fully developed GaN pyramids and 4.7±0.5 in case of partly formed GaN seeds, showing much higher growth rate on the (0001) plane than on the {101‾1} planes. The pyramid shape of the InGaN structures is a direct result of this difference in the growth rate.

The following is mainly related to the formation of a planar InGaN template, based on an InGaN pyramid 6, which may have been provided in accordance with the above. On a general level, the proposed solution involves a method for fabrication of an InGaN semiconductor template, comprising growing an InGaN pyramid having inclined facets on a semiconductor substrate;

processing the pyramid by removing semiconductor material to form a truncated pyramid having a first upper surface;

growing InGaN, over the first upper surface, to form an InGaN template layer having a c-plane crystal facet forming a top surface.

By developing and using this method, applicant has fabricated arrays of submicrometer-sized c-oriented InGaN platelets, also referred to herein as InGaN templates, with indium contents of up to 18%. The InGaN platelets are predominantly relaxed, free from dislocations and offer a top c-plane with single bilayer surface steps. Strong photoluminescence (PL) at room temperature (RT) has been observed with a full-width at half maximum (FWHM) of about 140 meV at 2.63 eV (indium content: 17%).

One embodiment within this general scope will be described with reference to FIGS. 2-6. These illustrate formation of InGaN platelets, achieved by growth on a dome-like InGaN surface which was obtained by chemical mechanical polishing (CMP) of InGaN pyramids. Using metal-organic vapor phase epitaxy (MOVPE), InGaN layers can be grown on such a dome-like surface with thicknesses from a few tens of nanometers up to a few hundreds of nanometers. The dome-like InGaN templates are fabricated on GaN/sapphire or GaN/Si substrates, as outlined with reference to FIG. 1, with a small contact area through 100-200 nm large openings in the growth mask. In this way, the lattice mismatch strain has no significant effect on the growth and the InGaN platelets are predominantly relaxed. The direct InGaN growth on the CMP-formed InGaN templates with similar indium contents completely eliminates the formation of dislocations. Such high quality InGaN platelets can be used as templates to e.g. grow green and red LEDs on the top c-plane with improved lattice match between the templates and InGaN QWs.

Figure 2:
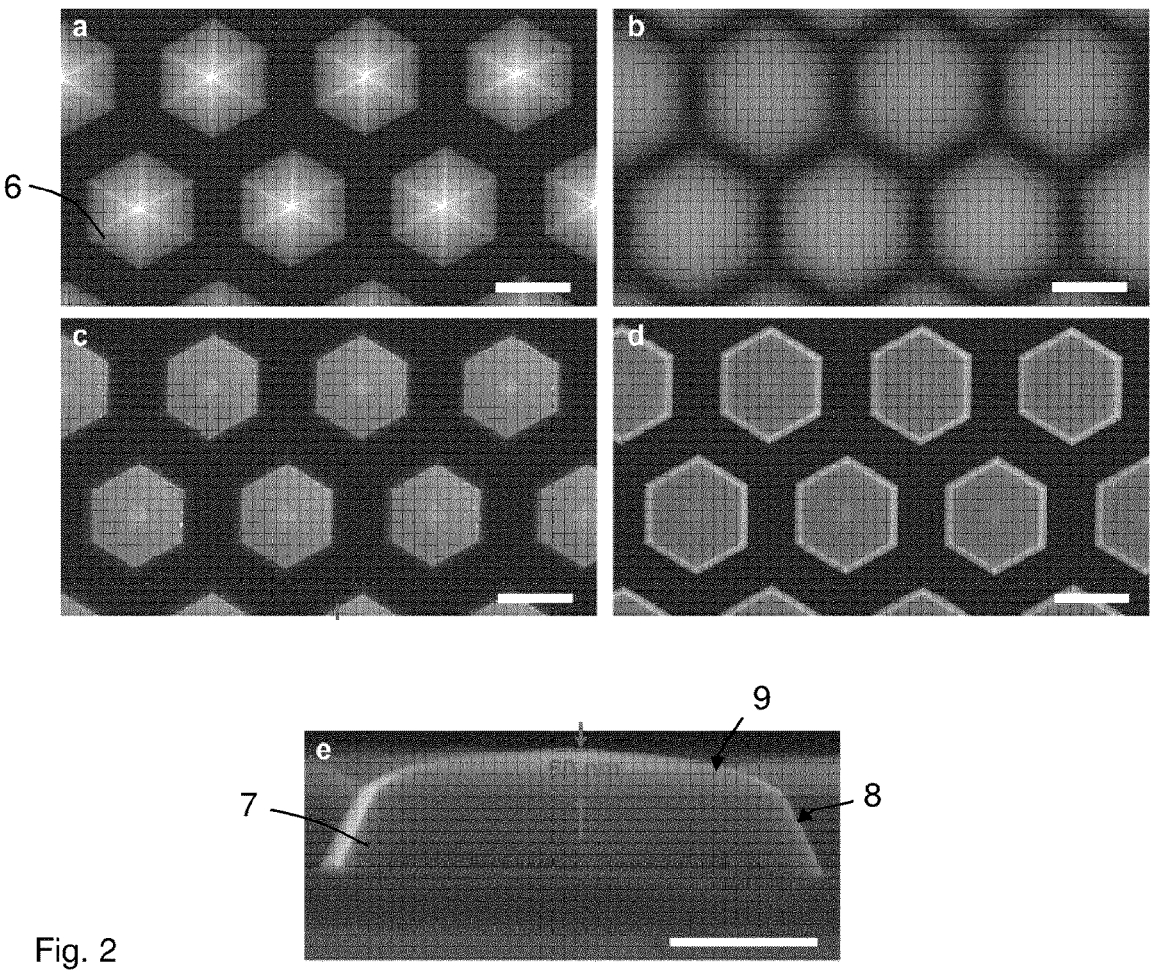
FIG. 2 shows various process stages in the processing of pyramids for formation of InGaN templates, according to some embodiments.

A series of scanning electron microscopy (SEM) images in FIG. 2 show the procedures to fabricate the InGaN templates by polishing dislocation-free InGaN pyramids 6. Scale bars in 2*a*-d: 500 nm and in 2*e*: 200 nm.

The InGaN pyramids were grown selectively on substrates of GaN/sapphire or GaN/Si from 100-200 nm large openings in a SiNx mask by MOVPE. Such InGaN pyramids 6, as shown in FIG. 2*a*, defined by six equivalent {101‾1} planes, are in various embodiments realized with an indium content of up to 20% (PL peak around 2.48 eV at RT (room temperature)).

In order to prevent the pyramids from being detached during the CMP, a layer of SiOx may be deposited on the samples by plasma enhanced chemical vapor deposition. The thus coated pyramids are shown in FIG. 2*b*.

In a subsequent step, removal of semiconductor material from the pyramids 6 is carried out, by polishing. Tests have been carried out on samples of 10×8 mm in size, carrying the illustrated pyramid distribution, which were then polished with a CMP machine. A slurry (SF1) with SiOx nanoparticles in it was used. FIG. 2*c* shows the structures after the CMP, where the top part of the pyramids is polished away, leading to the formation of a first upper surface. Depending on the polishing time, structures thinner than 100 nm can be obtained.

In order to remove the remaining SiOx nanoparticles and SiOx layers between the polished structures, HF etching may be conducted on the polished samples with the original SiNx growth mask as an etch stop layer, as shown in FIG. 2*d*.

In the top view SEM images of the structures after the CMP in FIGS. 2*c* and 2*d*, a brighter area at the structure center is visible. This is due to the InGaN growth on a local c-plane with less indium incorporation, in contrast to the major growth on {10⁻11} planes during the pyramid formation.

FIG. 2*e* shows a side-view SEM image of a polished pyramid 6, resulting in a truncated pyramid 7 still being laterally defined by its inclined side facets 8 and having a first upper surface 9 which is dome-like. The height offset is about 60 nm in contrast to the about 550 nm diagonal size of the top surface. The dome-like surface shows a larger curvature at the periphery than the central part. The origin of the dome-like surface formation may be different polishing rates between SiOx and InGaN, or the non-planarized/3-dimensional surface after the SiOx deposition.

Subsequent to the process of removing semiconductor material from the InGaN pyramids 6, a step of InGaN epitaxial growth is carried out, e.g. by MOVPE. In this embodiment, InGaN growth is carried out on the truncated pyramids 7 with similar indium contents (in terms of percentage), such as the same content or within a range of <5% or <2% difference. Applicant has used a MOVPE system with a 3×2-inch close coupled showerhead to grow the InGaN over the first upper surface 9. Triethylgallium (TEG), trimethylindium (TMI) and ammonia have been used as Ga, In and N precursors. For the InGaN growth with indium contents of 9-11% and 17-18%, the same ratio (0.9) of TMI/(TEG+TMI) in the gas phase was used. The V/III ratio was also the same for both cases, which was about 4000. In order to increase the indium content from 8-12% or even 9-11% to 16-20% or even 17-18%, the growth temperature was lowered from 790° C. to 770° C.

The step of growing InGaN over the first upper surface 9 on the samples as shown in FIGS. 2*d* and 2*e*, may thus be carried out by loading the samples back into the MOVPE reactor for additional InGaN growth in order to flatten the top c-plane. The conditions of the MOVPE process may be configured to achieve PL emissions at a similar photon energy as the original pyramids 6.

Figure 3:
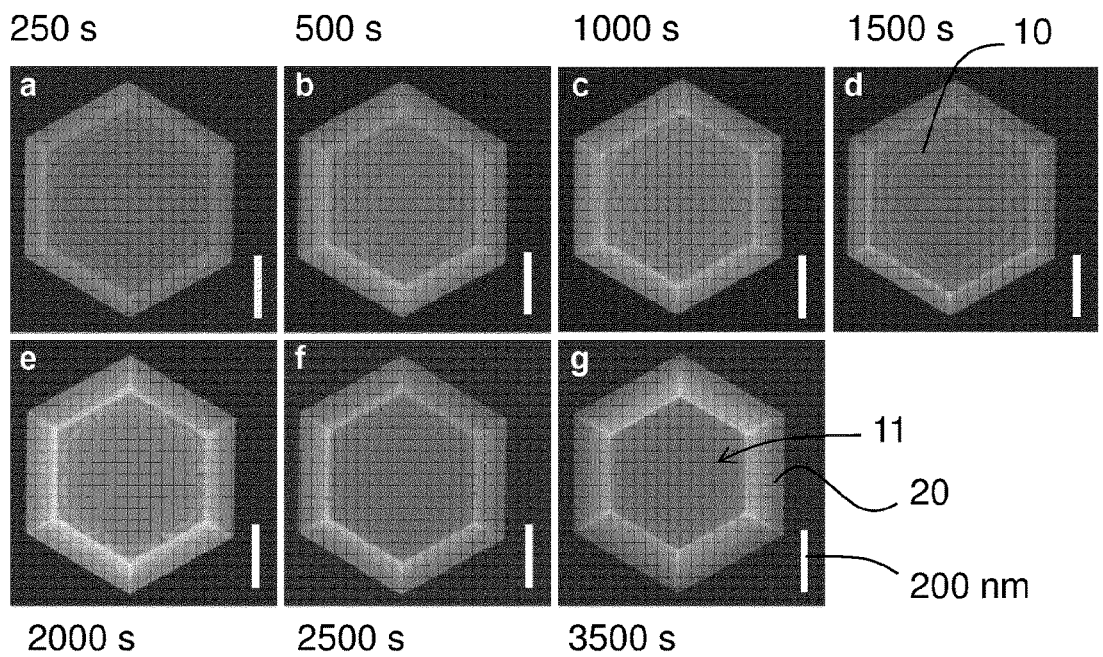
FIG. 3 show various process stages in further growth carried out on an InGaN template to obtain a flattened template surface, according to some embodiments.

FIG. 3 illustrates growth of additional InGaN over the upper first surface 9 to form a template layer 10 obtaining PL emissions at 2.88 eV, corresponding to an indium content of 11%. The drawing shows top-view SEM images of samples grown for different times from 250 s to 3500 s, with a scale bar of 200 nm. After 250 s growth, steps are observed on the top surface from the center to the periphery, i.e. at the intersection with the inclined side facets 8. With continued growth, the number of steps on the top surface is reduced, since the steps close to the periphery will reach the inclined {101‾1} facets and terminate there, due to the extremely low growth rate on the {101‾1} planes. Meanwhile, the flat plateau, formed at the top surface center, expands to cover the whole top surface when the growth time is longer than 2500 s. Even though this plateau seems to expand substantially isotropically on the top surface, a few notches are still observed around the plateau as shown in FIGS. 3d-3f. There are two types of step edges for nitride growth on c-plane, denoted as type A and B, depending on number of dangling bonds on the edge atoms. During the growth, type A and B step edges can form a zigzag-shaped step, which may be a reason for the notch formation. However, surface damage during the CMP could not be ruled out for the formation of such notches. The pits shown at the edges to the inclined {101—1} facets in FIG. 3f are caused by the notches, rather than by dislocations. With prolonged growth times, the pits are filled up and a flat top c-plane is obtained as shown in FIG. 3g, where the thickness of the grown InGaN layer at the center is 40-50 nm. Note that the base size of the platelets does not show any visible change for any of the samples in FIG. 3 since the growth on the inclined {101—1} facets is extremely slow due to N-termination of the surface. In one embodiment, the step of growing InGaN over the upper first surface is thus carried out in a MOVPE chamber under provision of Ga, In and N precursors at a temperature of 750-800° C., selected to determine the In content of the grown layers. In some embodiments, this growth process is carried out for >2500 s, such as >3000 s, or >3500 s, e.g. 3500-4000 s, to obtain a c-plane crystal facet forming a planar top surface 11. In some embodiments, the additional growth provides an additional thickness over the first upper layer of >30 nm, such as 40-50 nm.

Figure 4:
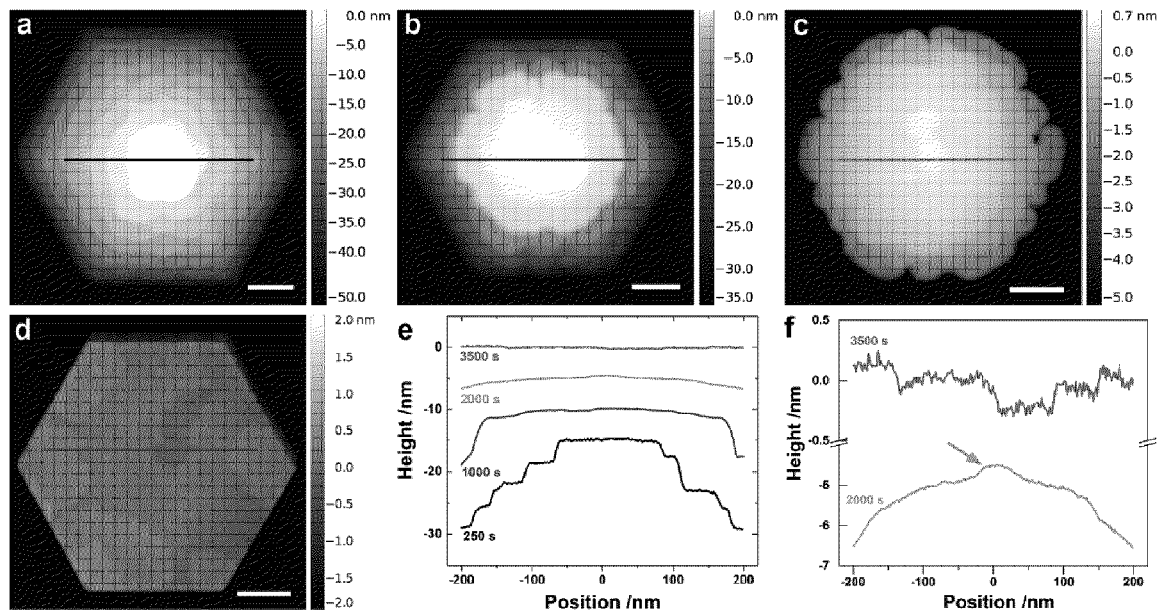
FIG. 4 shows characterization of the top surface after InGaN growth for different times.
Figure 5:
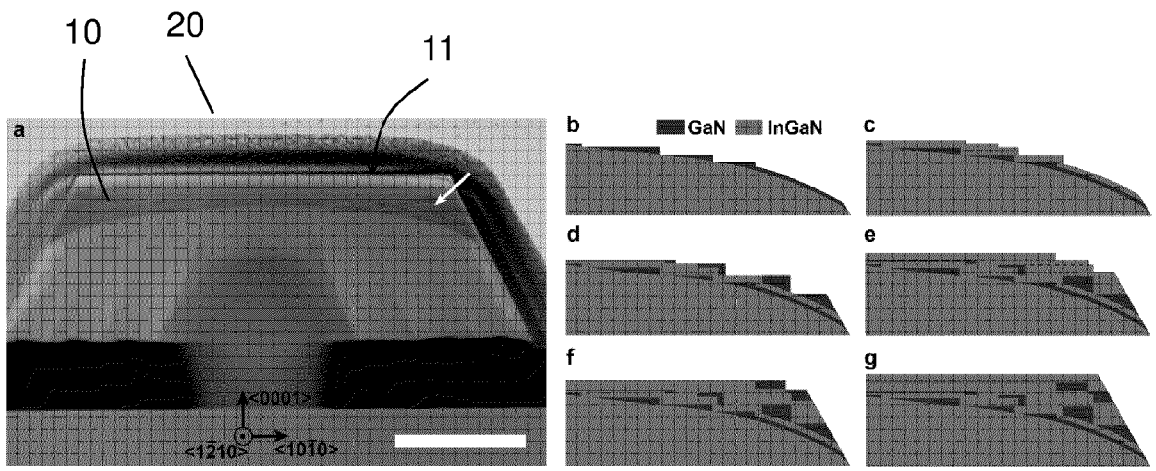
FIG. 5 shows characterization and schematics of the growth progression of the InGaN with GaN marker layers inserted during the InGaN growth.
Figure 6:
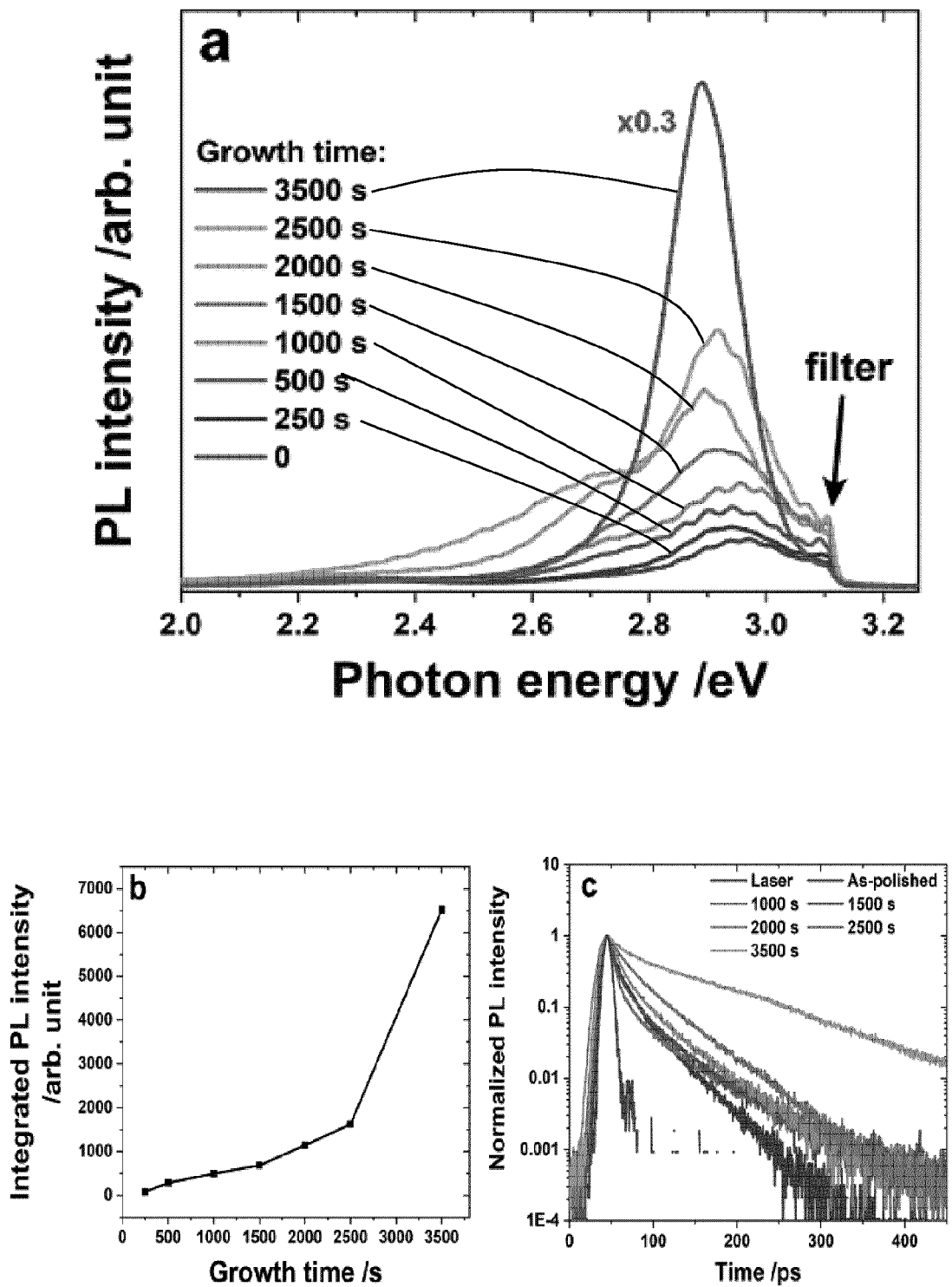
FIG. 6 illustrates optical characterization of the samples grown for different growth times.

FIG. 4 illustrates results of AFM conducted on the samples grown for 250 s, 1000 s, 2000 s and 3500 s according to the presented method. The surface steps that were observed by SEM, shown in FIG. 3, are also clearly visible in the AFM images in FIGS. 4a-c. According to the line profiles in FIG. 4e, the step height is much larger than 0.26 nm which is the value corresponding to a single bilayer thickness on the c-plane for this indium content. The observed steps can be as high as 6-7 nm, corresponding to a step bunching of over 20 single bilayers. The surface polished by CMP, prior to InGaN growth, is expected to exhibit single bilayer steps. If we assume that the dome-like surface shown in FIG. 2e is evenly decorated with single bilayer steps, there are over 200 such steps from the top surface center to the edge, and the average step width is about 1 nm based on the dome height and the top surface extension shown in FIG. 2e. Such a step width is much smaller than the adatom diffusion length, which leads to a step instability during the growth. As a result of this, step bunching usually takes place, explaining the surface structures observed in FIGS. 3 and 4. In FIG. 4c, a bump can be observed at the surface center, and the corresponding line profile in FIG. 4f shows this to be one single bilayer high. This indicates the nucleation of surface steps from the center of the plateau before all the bunched steps are terminated by the inclined {101—1} facets. Once the plateau expands over the top surface completely, the nucleation site moves to the six corners between the top c-plane surface and the inclined {101—1} facets, as shown in FIG. 4d. New surface steps initiated at the six corners propagate towards the center of the top surface and a low-lying "valley" is observed because of this (FIG. 4d). The corresponding line profile in FIG. 4f shows that the height of all the steps is 0.2-0.3 nm, in line with a single bilayer height of 0.26 nm.

The lateral surface development during the growth of InGaN over the first upper surface is illustrated by FIGS. 3 and 4. In order to better understand how the growth takes place in the vertical/c-direction, 4 thin GaN layers are inserted as markers during the InGaN growth and the first GaN layer is grown directly on the polished InGaN surface. FIG. 5a shows a cross-sectional scanning TEM image recorded using high-angle annular dark-field, where GaN is dark and InGaN is bright in contrast. Schematics were made in FIG. 5b-g based on FIG. 5a, showing how the growth develops for the first 3 GaN marker layers and the corresponding InGaN layers. FIG. 5a shows that the growth mainly takes place at the curved periphery sides for the growth to the second GaN marker layer (also refer to FIG. 5b-d). With the growth of the third InGaN layer, the dome-like surface is almost completely flattened. The first GaN marker layer, grown directly on the polished InGaN surface, shows step bunching which leads to separated sections in the area between the top surface center to the periphery. In the area close to the periphery, the first GaN marker layer seems to grow continuously on the curved surface due to the larger curvature. InGaN growth continues from the GaN step edges. During the same growth section of InGaN, the upper InGaN terrace can grow onto the bottom InGaN terrace and a dark interface is left. One such example is shown by the arrow in FIG. 5a and this is marked accordingly in FIG. 5e with a dashed black line. This could arise from indium desorption on the free InGaN terrace before it is covered by an upper one, leading to elemental contrast. Besides the growth on the small terraces at the periphery, the second and third InGaN layers at the surface center grow symmetrically on both sides from the center. This further confirms the nucleation at the plateau center before the dome-like surface is completely flattened, which was observed by the AFM characterization above. The dimensions of these two layers show much faster lateral than vertical growth, with a ratio of 60-70.

Once the InGaN growth of the template layer to flatten the dome-like first upper surface 9 to obtain the c-plane crystal facet as top surface 11, the optical quality of the InGaN layer is greatly enhanced as shown by the RT PL spectra in FIGS. 6a-b. The integrated PL intensity increases linearly with the growth time until 2500 s and then shows an abrupt increase for the 3500 s growth (FIG. 5b). The integrated PL intensity of the sample grown for 3500 s is 80 times that of the sample grown for 250 s and 4 times that of the sample grown for 2500 s. The FWHM of the PL spectrum for the 3500 s growth is 140 meV, in contrast to 260 meV for the as-polished InGaN template. In the total InGaN template 20, the volume of the as-polished InGaN template 7 is much larger than the layer 10 grown for 3500 s, as shown by the TEM image in FIG. 5a. However, the as-polished InGaN template shows a much lower PL intensity. This is believed not to be due to the surface damage from the CMP, but rather to C and O impurities incorporated during the InGaN pyramid growth on {101—1} facets.

FIG. 6c shows the time-resolved PL spectra measured at the peak energy for the samples grown for different times. The as-polished template is also included together with the setup response to the laser. For the samples with a growth time shorter than 3500 s, the spectra are dominated by a fast decay. For the sample grown for 1000 s, the intensity decays even faster than the as-polished InGaN template. This indicates one more mechanism contributing to the non-radiative recombination, which is most probably related to the bunched steps. With the continued growth, the fast decay becomes slower, consistent with the reduced number of the bunched steps and the increase of the PL intensity. For the growth from 2500 s to 3500 s, the decay becomes much slower for both the fast and the slow components, explaining the abrupt increase of the PL intensity. This also indicates that the pits at the edges for the 2500 s growth, resulted from the notches, play the same role as the bunched steps on the carrier recombination.

In another embodiment, the corresponding method may be adjusted for fabrication of InGaN platelets 20 with PL emissions at 2.63 eV, corresponding to an indium content around 17%. Tests have been made to study the quality of the grown layer 10 by CL measurements on samples with the InGaN layers 10 grown for 4 hours (layer thickness: about 300 nm) with an indium content of about 9% and 18%, in different samples. Due to the low growth rate of the inclined $\{10\bar{1}1\}$ facets, the top c-plane shrinks with the thick layer growth. Even though the layer thickness is around 300 nm, the top surface is still smooth with both indium levels of content, indicating insignificant influence from the strain and the phase separation.

One embodiment within the general scope will now be described with reference to FIGS. 7-11. These illustrate formation of InGaN platelets 20, achieved by reformation including etching, such as annealing, of InGaN pyramids. In various embodiments, this may also include growing an intermediate layer onto the etched truncated pyramids, before growing the template layer.

The proposed method is usable for synthesizing an InGaN sub-micron-platelet 20, or arrays of InGaN sub-micron-platelets 20, by selective area MOVPE plus a reformation process step that turns the pyramidal shape 6 into a c-oriented platelet 7. The InGaN hexagonal platelets have a thickness of 100-200 nm and an upper first surface 12 forming a c-plane with a size of a few hundred nanometers. The platelets are prepared by in-situ annealing of the hexagonal c-oriented InGaN pyramids 6, as in FIG. 1, defined by six $\{10\bar{1}1\}$ planes. In the annealing step, the pyramids 6 are etched down from the apex, resulting in the formation of a c-plane top 12. The rough c-plane 12 formed by the annealing can be flattened by InGaN regrowth 13, showing single bilayer steps. The InGaN platelets show narrow photoluminescence (PL) peaks with full widths at half maximum (FWHM) of 107 meV for $In_{0.09}Ga_{0.91}N$ and 151 meV for $In_{0.18}Ga_{0.82}N$. Tests have also shown that the use of an InGaN template layer 10 enhances the indium incorporation into the InGaN QW due to the reduced compressive strain. Based on this approach, various embodiments are provided to fabricate QW LEDs grown on such InGaN platelets 20, emitting green on $In_{0.09}Ga_{0.91}N$ and red on $In_{0.18}Ga_{0.82}N$ at room temperature.

Figure 7:
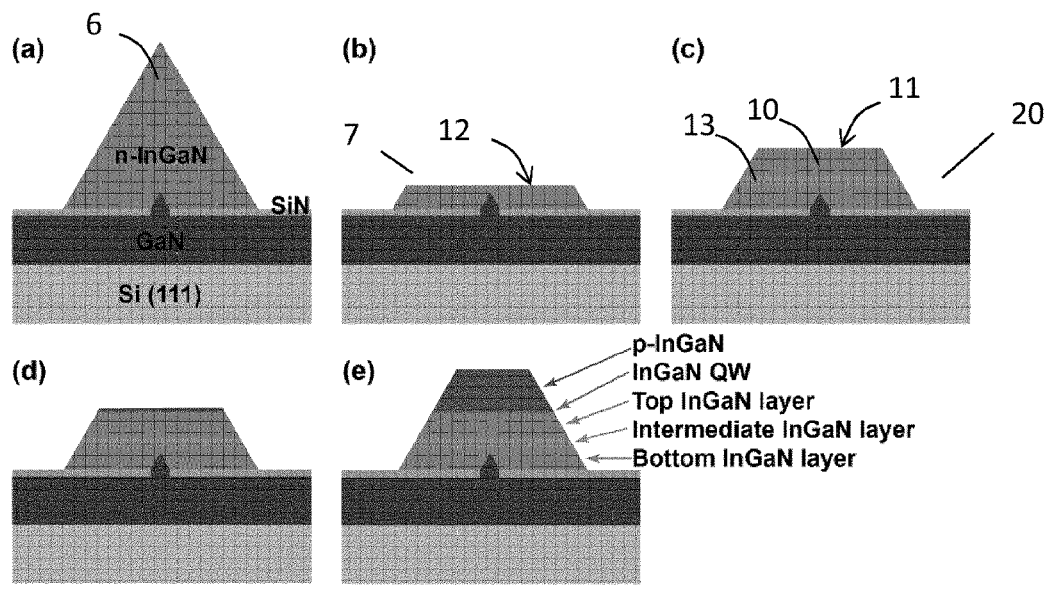
FIG. 7 illustrates procedures to synthesize InGaN platelets and LED structures according to various embodiments.

The growth procedures are shown in FIG. 7 for the synthesis of the InGaN platelets and single QW LED structures on them. It starts from arrays of InGaN pyramids 6 selectively grown on patterned (0001) GaN/Si substrates with SiN as a growth mask (FIG. 7a), as described with reference to FIG. 1. After the growth of InGaN pyramids 6, in-situ annealing is conducted under $NH_3$ ambient at a temperature of 1070° C. Without the $NH_3$ during the annealing, the InGaN pyramids would decompose completely. With the $NH_3$ protection, the InGaN pyramids decompose from the top apex, leading to the formation of a top c-plane, while the six inclined $\{10\bar{1}1\}$ facets of the pyramids are left intact. With continuing annealing, the c-plane increases in size with the etching moving downward as shown in FIG. 7b. The c-plane first upper surface 12 of this of bottom InGaN layer remaining from the annealing tends to be rough, with islands in a size of a few tens nanometers as shown in FIGS. 8b and 8e. InGaN regrowth is therefore made on the bottom InGaN layer to flatten the c-plane and enhance the quality of InGaN (FIG. 7c), including an intermediate InGaN layer 13 first and then a top InGaN template layer 10.

With reference to FIG. 7, the preparation of the InGaN template 20 may be followed by the growth of an InGaN single QW on the c-plane (FIG. 7d) and p-InGaN (FIG. 7e) to realize a LED structure based on the InGaN platelet templates 20.

Figure 8:
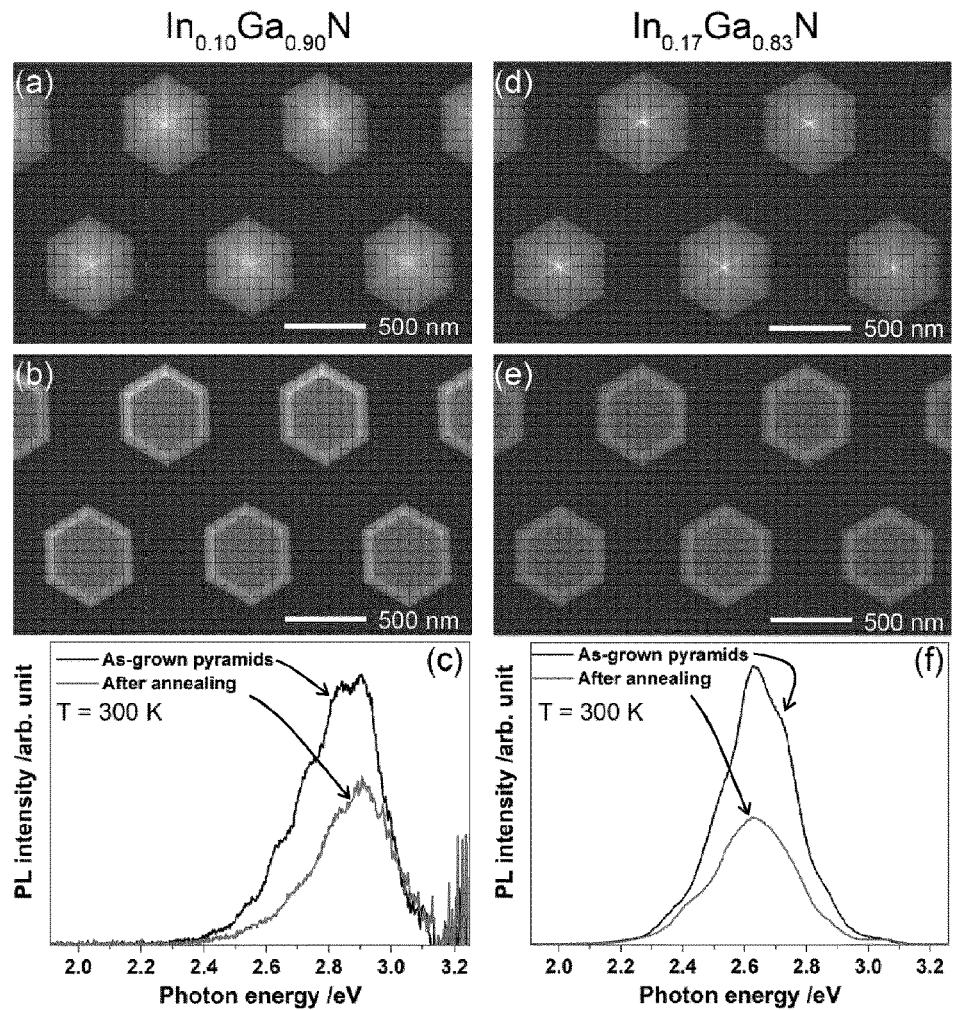
FIG. 8 shows images and data related to InGaN pyramids before and after in-situ annealing with two different indium contents, according to various embodiments.

FIG. 8 shows the as-grown InGaN pyramids 6 (FIGS. 8a and 8d) and the morphology after the annealing (FIGS. 8b and 8e) for two indium contents of 10% and 17%. For both indium contents, the diagonal base size was about 630 nm and the same annealing behavior was observed. As mentioned above, a c-plane top surface 12 was formed due to the etching from the top apex by the high temperature annealing. After the annealing, the remaining $\{10\bar{1}1\}$ facets of the truncated pyramid 7 were still smooth, and the diagonal base size showed no change compared with the as-grown InGaN pyramids 6. PL spectra were measured at room temperature before and after the annealing, shown in FIGS. 8c and 8f. After annealing, the PL intensity (FIGS. 8c and 8d) was lower, but the peak positions did not present any visible shift, indicating similar indium content. Note that indium contents of 10% and 17% were obtained based on the positions of the PL peaks.

Figure 9:
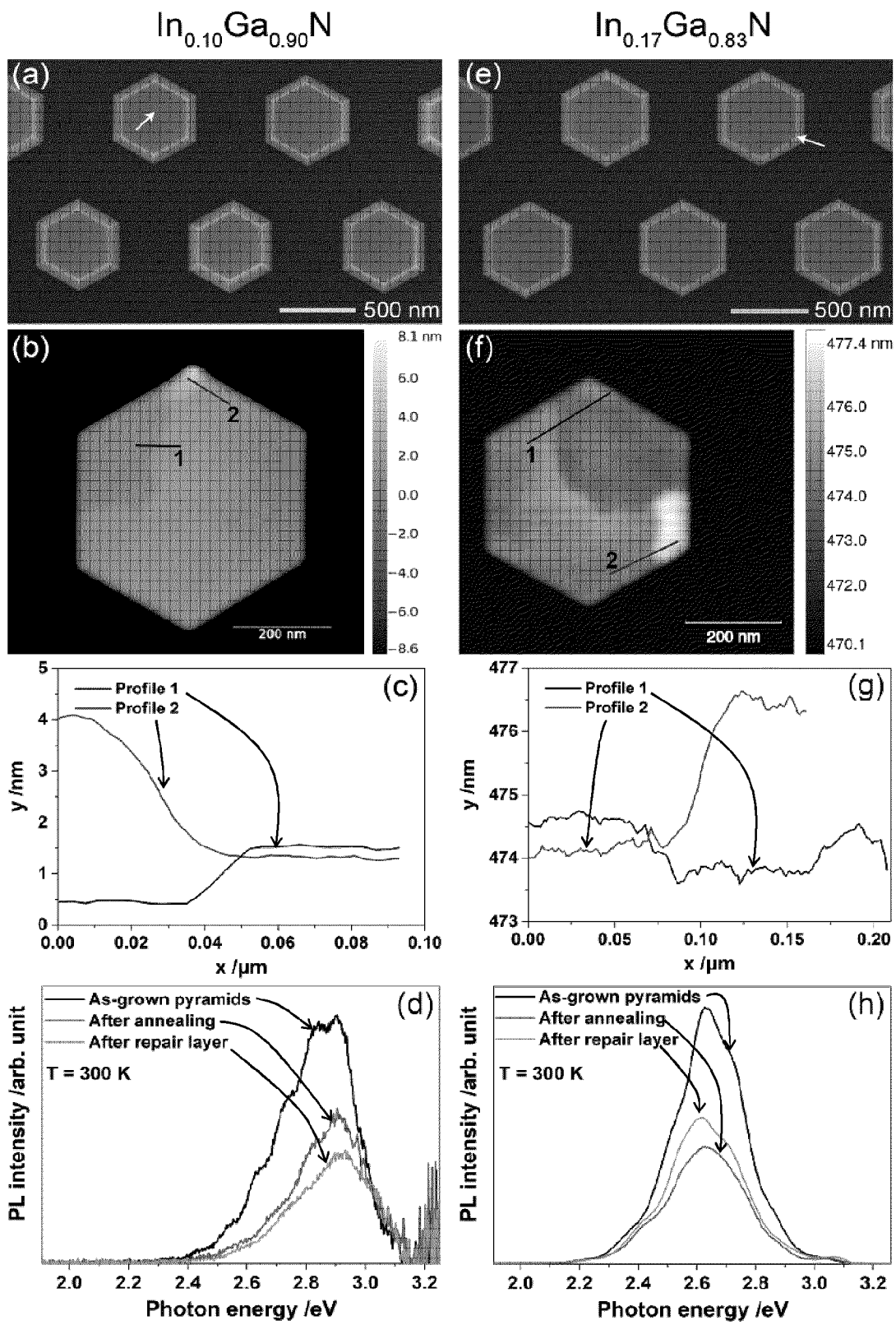
FIG. 9 shows images and data related to intermediate InGaN layer growth on annealed InGaN pyramids of different Indium content to flatten the rough c-plane surface remaining after annealing.

Regrowth of InGaN may be carried out directly on the upper first surface 12 of the bottom InGaN layer remaining from the annealing of the pyramids 6, with PL emission at the same wavelength range, to flatten the c-plane surface. However, applicant has found that due to the rough upper surface after such annealing, pits are observed after the regrowth on the c-plane. To suppress the pit formation, an intermediate layer 13 of InGaN may be grown directly onto the upper first surface 12 after the annealing. This is shown in FIG. 9. This intermediate layer 13 was grown with a low V/III ratio of 700, which is close to the limit for indium and gallium droplet formation. These conditions lead to a metal-rich surface and longer adatom diffusion length, making it efficient to flatten the rough surface. The indium content in this layer is less than 5%. On top of this intermediate InGaN layer 13, a top InGaN template layer 10 was grown with the similar PL emission energy as the bottom InGaN layer, i.e. as for the pyramids 6.

Figure 10:
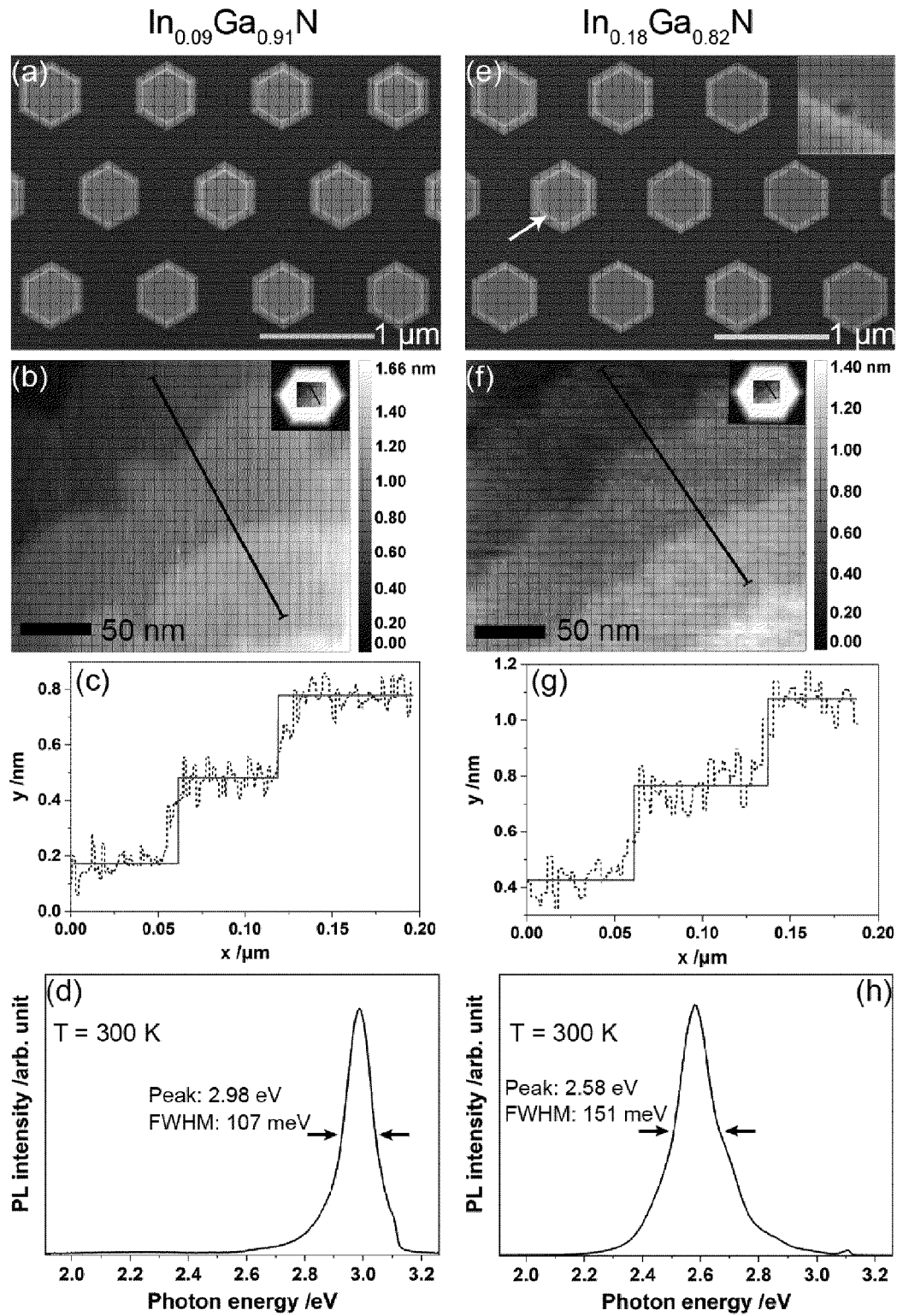
FIG. 10 shows images and data related to InGaN platelets with different Indium content formed by regrowth on the annealed InGaN pyramids.

FIG. 10 shows the growth results of the template layer 10 with two different indium contents of 9% and 18%. From the images by scanning electron microscopy (SEM) in FIGS. 10a and 10e, the c-plane surface is smooth for both samples. For the $In_{0.09}Ga_{0.91}N$ platelets, no pits were observed. However, pits can occasionally be seen for the $In_{0.18}Ga_{0.82}N$ platelets (such as the one indicated by the white arrow and shown by the inset in FIG. 10e) most probably because of the large lattice mismatch to the underlying intermediate layer. Due to the extremely low growth rate of the inclined $\{10\bar{1}1\}$ planes, the InGaN regrowth mainly took place on the top c-plane and this top InGaN layer is about 40-50 nm thick for both samples. FIGS. 10b and 10f show atomic force microscopy (AFM) images on the top c-planes. Surface steps were observed for both samples with the step width of about 70 nm. Based on the height profiles shown on FIGS. 10c and 10g, the observed step heights amount to 0.30±0.05 nm for $In_{0.09}Ga_{0.91}N$ platelet and 0.32±0.07 nm for $In_{0.18}Ga_{0.82}N$ one, corresponding to a single bilayer thickness on c-plane. The surface steps propagate along the $\langle 11\bar{2}0 \rangle$ direction (from corner to corner in platelets) with jagged step edges due to the alternative switch between type A (two dangling bonds per edge atom) and type B (one dangling bond per edge atom) step edges. This step orientation is believed to be related to the preferential nucleation at the corners between the top c-plane and two adjacent {101¯1} planes. This was observed during the intermediate layer growth as shown in FIG. 9. PL measurements were conducted for both samples at room temperature (FIGS. 10*d* and 10*h*). Both PL spectra show similar peak positions as the original InGaN pyramids, but with much smaller FWHMs. The indium contents in FIG. 10 were also obtained based on these two PL spectra. The results in FIG. 10 show that InGaN platelets 20 with a smooth top surface 11 and good optical properties were prepared.

Figure 11:
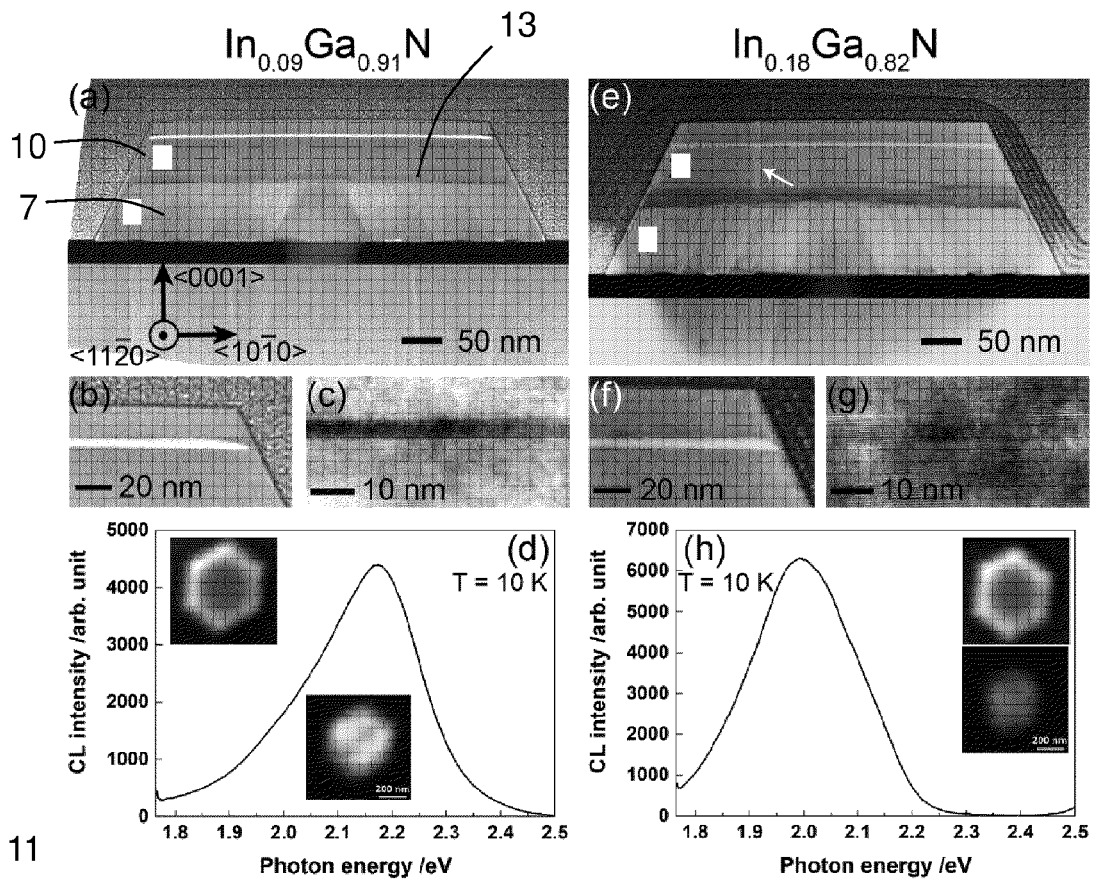
FIG. 11 shows images and data related to single QW of InGaN grown on the InGaN platelets.

FIG. 11 shows single QW of InGaN grown at the same conditions on the platelets 20 of $In_{0.09}Ga_{0.91}N$ and $In_{0.18}Ga_{0.82}N$ in FIGS. 11*a* and 11*e*, by means of cross-sectional HAADF-STEM images of the single QW samples. EDS measurements were conducted on the bottom InGaN layer 7 and the top InGaN template layer 10, and the data are shown in Table 1 below. FIGS. 11*b* and 11*f* are magnified HAADF-STEM images close to the periphery, and FIGS. 11*c* and 11*g* are high resolution TEM images recorded in the middle of the QWs. FIGS. 11*d* and 11*h* show CL spectra measured at 10 K, showing the emissions from the single QWs on both samples. Insets illustrate SEM images and corresponding monochromatic CL images with the emissions from the QW. CL images were recorded with an energy window of 1.80-2.5 eV in (d) and 1.85-2.35 eV in (h).

With reference to FIG. 11, two samples with a single InGaN QW were grown on InGaN platelets 20 with indium contents of 9% and 18%. On top of the QW, an InGaN cap layer was grown at the same conditions as the InGaN template layer 10 and the thickness of the cap layer was around 20 nm. FIG. 11 shows the cross-sectional transmission electron microscopy (TEM) images and optical measurements by cathodoluminescence (CL) at 10 K. FIGS. 11*a* and 11*e* are overview high-angle annular dark-field scanning TEM (HAADF-STEM) images of the QW on both $In_{0.09}Ga_{0.91}N$ and $In_{0.18}Ga_{0.82}N$ platelet templates. The single QW can be clearly seen as a white line at the top of the structures. In total, 5 platelets from each sample were characterized using TEM. For the QW on $In_{0.09}Ga_{0.91}N$, no dislocation was observed in the platelet structures. This was confirmed by STEM imaging at low-angle annular dark-field conditions, which is sensitive to crystallography. However, dislocations were formed for the QW sample on $In_{0.18}Ga_{0.82}N$ (indicated by the white arrow in FIG. 11*e*), which originated from the interface between the intermediate layer 13 and the bottom InGaN layer 7 due to the larger lattice mismatch. This dislocation propagated to the top surface through the QW. The single QW is uniform in thickness with sharp interfaces, as shown in FIGS. 11*c* and 11*g*. The only exceptions are close to the periphery, where the QW becomes thinner until it disappears completely at the surface (FIGS. 11*b* and 11*f*). FIGS. 11*b* and 11*f* do not show any clear QW growth on the inclined {101¯1} facets. The QW and the cap layer (and also p-InGaN as shown below) grow mainly on the c-plane, thereby rebuilding the pyramid shape. The slow growth rate on the {101¯1} facets can be explained by the above-mentioned H-passivation which inhibits adsorption of Ga atoms to the {101¯1} facets.

For all TEM specimens, the indium contents were measured with EDS on the bottom InGaN layers 7 and the top InGaN layers 10 in FIGS. 11*a* and 11*e*. Layers 7 and 10 were calibrated to have similar PL emission energy with separate growth for both InGaN platelets, which means that layers 7 and 10 are supposed to have similar indium contents for each platelet sample, such as the same indium content or within a certain tolerance level. The indium contents obtained by PL and EDS for layers 7 and 10 are listed in Table 1 in FIG. 11I for both types of platelet samples. Note that the data from PL are based on the calibration samples, rather than the specific ones in FIGS. 11*a-h*.

The indium contents from the EDS measurements for layer 7 are much lower than the ones obtained from the PL data, especially for the $In_{0.18}Ga_{0.82}N$ sample. PL and EDS show consistent indium content in layer 10 for both platelet samples. The obtained EDS data were based on the measurements on all platelets in the TEM analysis. Indium content fluctuation is well known for the InGaN growth, which can form localized, indium-rich radiative centers. Excited carriers can diffuse to such indium-rich centers and recombine there, leading to an overestimation of the indium content by PL. This could explain the large indium content discrepancy in layer 7 between PL and EDS data. The InGaN layer 10 show much better quality with reduced indium content fluctuation based on the consistent PL and EDS data.

FIGS. 11*d* and 11*h* show typical low temperature CL emission from single QWs of these two samples. The QWs on $In_{0.09}Ga_{0.91}N$ and $In_{0.18}Ga_{0.82}N$ platelets were grown at the same conditions, including the growth time. The emission peak was shifted from 2.17 eV (yellow) on the $In_{0.09}Ga_{0.91}N$ platelet to 1.95 eV (red) on the $In_{0.18}Ga_{0.82}N$ platelet. The c-plane size of $In_{0.18}Ga_{0.82}N$ platelet before the QW growth is slightly smaller than on the $In_{0.09}Ga_{0.91}N$, resulting in a thicker QW on $In_{0.18}Ga_{0.82}N$ (5.8±0.4 nm) than the one on $In_{0.09}Ga_{0.91}N$ (4.5±0.2 nm). The thicker QW can lead to a red-shift of the emissions due to the QCSE. Meanwhile, the indium content in the QW grown on $In_{0.18}Ga_{0.82}N$ platelets could be higher due to reduced indium pulling effect, compared with the QW grown on $In_{0.09}Ga_{0.91}N$ platelets. This also contributes to the red-shift of the emissions from the QW on $In_{0.18}Ga_{0.82}N$ platelets. The insets in FIGS. 11*d* and 11*h* are the monochromatic CL images of the QW emission (yellow or red depending on the emission wavelength) together with the SEM images. In general, the emission is distributed uniformly on the QW area. The dark line features in the CL images could be due to the step bunches formed during the intermediate layer growth as shown in FIG. 9.

Figure 12:
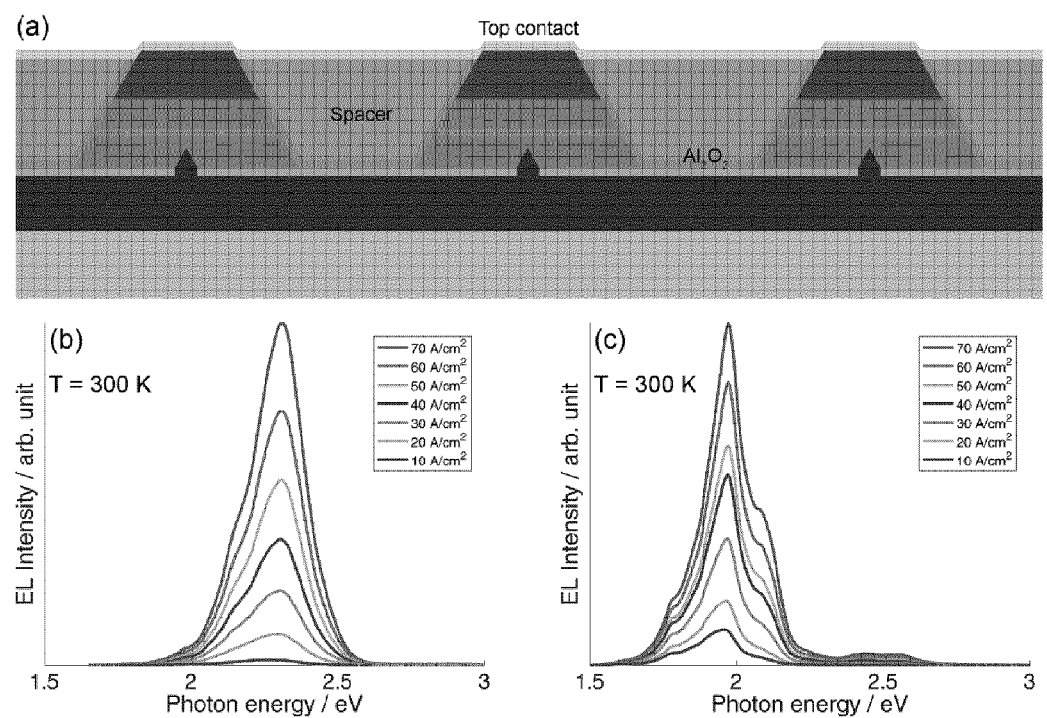
FIG. 12 shows schematic illustration and data related to process and EL measurements of prototype InGaN platelets with a semiconductor LED epitaxially grown thereon, according to various embodiments.

Based on the results above, a p-InGaN layer was grown on top of the single QW and LED devices were thus fabricated. A sketch of the LED devices is shown in FIG. 12*a*. The n-type contact was made to the underlying GaN buffer layer and the p-type contact was made to the top p-InGaN layer. To electrically isolate the top contact from the QW and n-InGaN, two insulating layers were added: First, a passivating layer of $Al_2O_3$ was deposited by atomic layer deposition. Second, a planarizing polymer spacer was used to lift the top contact so that it only connects to the p-InGaN. The polymer spacer was also used as an etch mask to remove the $Al_2O_3$ on the p-InGaN. The p-type contact had a circular shape with a diameter of 360 μm, contacting approximately $1.2 \times 10^5$ platelets. FIGS. 12*b* and 12*c* illustrate the electroluminescence (EL) spectra under different current injection levels, showing green emission (2.30 eV) on the $In_{0.09}Ga_{0.91}N$ platelets and red emission (1.98 eV) on the $In_{0.18}Ga_{0.82}N$ platelets. It shall be noted that in the diagrams of FIGS. 12*b* and *c*, the inserted table identifies each graph in amplitude level order, i.e. the highest current injection level maps to the highest EL intensity and so forth. The FWHMs of the spectra at a current density of 70 A/cm² are 210 meV and 150 meV for the green and red LEDs, respectively. Note that the green and red single QWs were grown at different conditions here, possibly explaining the narrower EL spectra for the red LEDs, compared with the green one. Compared with the CL spectra in FIGS. 11d and 11h, EL spectra in FIG. 12 show smaller linewidths. This could be due to a strong carrier injection during the EL measurement, where the emissions are mainly from recombination at ground state while the localized states are saturated. Meanwhile, EL spectra were recorded from QWs on a large number of platelets, in contrast to the CL spectra from a QW on a single platelet. In this way, the EL peak can get magnified with emissions from much larger QW volume, also possibly leading to a smaller linewidth.

The solutions proposed herein provide methods for fabrication of an InGaN semiconductor template. Moreover, a semiconductor device is in various embodiments fabricated on such a semiconductor template. This is in various embodiments carried out by growing additional semiconductor layers on the template layer to form a heterostructure, wherein at least one of said additional semiconductor layers has a different composition than said template layer. In the foregoing, this has been exemplified in conjunction with FIG. 12. It shall be noted, though, that such a semiconductor device may be fabricated also on an InGaN template fabricated as described with reference to FIGS. 2-6. Moreover, although FIG. 12 exemplifies a heterostructure in the form of a LED, other types of heterostructures may likewise be formed, including both electronic devices such as a diode, MOSFET, JFET, HEMT etc., and opto-electronic devices such as LEDs and microLEDs.

The solutions proposed herein provide several benefits to the art of semiconductor manufacturing. Self-emissive displays based on red, green and blue microLEDs are drawing increasing attention. While microLEDs made of nitride semiconductors are chosen for green and blue colors, red microLEDs form a bottleneck for large-scale display applications. Red nitride microLEDs are expected to have more stable light output and less wavelength shift than the AlInGaP counterparts, but their efficiency is still too low. High quality relaxed $In_xGa_{1-x}N$ templates are thus beneficial for $In_yGa_{1-y}N$ quantum wells (where x<y), in order to improve the performance of red nitride light emitting diodes (LEDs), rather than using GaN templates. Compared to an InGaN QW grown on a GaN template, the same QW grown on an InGaN template has a much smaller compressive strain, leading to more efficient indium incorporation, lower density of defects and a reduced quantum confined Stark effect. InGaN layers with an indium content around 5% have previously been studied as a buffer layer or underlayer for the InGaN QW growth and the observed luminescence enhancement was attributed to the filtering of point defects by this InGaN layer. In order to achieve highly efficient green and red LEDs (IN contents in the QWs: 25% and >35%, respectively) which are important for ultra-high resolution and high brightness display applications based on microLEDs, high quality InGaN layers with indium contents well above 5% are clearly needed as the buffer layer. This is provided by the solutions described herein.

In the foregoing, solutions have been described for fabrication of InGaN templates, and arrays of InGaN templates, wherein each template is a predominantly relaxed InGaN platelets with indium contents of up to 18% or more, free from dislocations and offering a smooth top c-plane. The top c-plane of the as-formed InGaN platelets can be used as a high quality template for red microLEDs. One benefit of this is that by using the technology proposed herein, a common general template type can be used for fabricating both red, green and blue microLEDs. This provides the possibility of creating a true RGB display where a common LED current driver type may be used for all microLEDs.

The invention claimed is:

1. A method for fabrication of an InGaN semiconductor template, comprising:
    growing an InGaN pyramid having inclined facets on a semiconductor substrate;
    processing the pyramid by removing semiconductor material to form a truncated pyramid having a first upper surface;
    growing InGaN, over the first upper surface, to form an InGaN template layer having a c- plane crystal facet forming a top surface; and
    depositing a coating layer on the pyramid, prior to removing semiconductor material;
    wherein the processing comprises:
    polishing the thus coated pyramid to form the truncated pyramid, and
    etching the truncated pyramid to remove remaining coating material.

2. The method of claim 1, wherein the step of polishing comprises chemical mechanical polishing.

3. The method of claim 1, wherein the first upper surface is non-uniform, and wherein the growing of InGaN over the first upper surface provides flattening of the truncated pyramid.

4. A method for fabrication of an InGaN semiconductor template, comprising:
    growing an InGaN pyramid having inclined facets on a semiconductor substrate;
    processing the pyramid by removing semiconductor material to form a truncated pyramid having a first upper surface; and
    growing InGaN, over the first upper surface, to form an InGaN template layer having a c- plane crystal facet forming a top surface;
    wherein the step of processing the pyramid comprises etching the pyramid;
    wherein the etching is performed by in-situ annealing.

5. The method of claim 4, further comprising:
    growing an intermediate InGaN layer comprising a plurality of epitaxial layers directly onto the onto the first upper surface, to form a second upper surface; and
    growing InGaN onto the second upper surface to form said InGaN template layer.

6. The method of claim 5, wherein the intermediate InGaN layer is grown with an Indium content of >0% and <5%.

7. The method of claim 4, wherein the InGaN template layer is grown with an Indium content of 5-20%.

8. The method of claim 4, wherein the InGaN pyramid and the InGaN template layer are grown with the same relative Indium content, within a predetermined tolerance level.

9. The method of claim 4, wherein growing an InGaN pyramid comprises epitaxially growing InGaN on a dislocation-free GaN seed structure provided in a mask opening on the semiconductor substrate.

10. The method of claim 9, wherein said mask opening has a width in the range of 60-200 nm.

11. A method for fabricating a semiconductor device, comprising:
    fabricating an InGaN semiconductor template according to claim 4; and
    growing additional semiconductor layers on the template layer to form a heterostructure, wherein at least one of said additional semiconductor layers has a different composition than said template layer.

12. The method of claim 11, wherein the semiconductor device is a green light LED, and wherein at least one of said additional layers is grown with an Indium content of 20-30%.

13. The method of claim 11, wherein the semiconductor device is a red light LED, and wherein at least one of said additional layers is grown with an Indium content of >35%.

\* \* \* \* \*